United States Patent [19]

Kirkpatrick et al.

[11] 4,064,495

[45] Dec. 20, 1977

[54] ION IMPLANTED ARCHIVAL MEMORY MEDIA AND METHODS FOR STORAGE OF DATA THEREIN

[75] Inventors: Conilee G. Kirkpatrick, Schenectady; James F. Norton, Alplaus; George E. Possin, Schenectady, all of N.Y.

[73] Assignee: General Electric Company, Schenectady, N.Y.

[21] Appl. No.: 669,404

[22] Filed: Mar. 22, 1976

[51] Int. Cl.$^2$ ............... G11C 17/06; G11C 11/36
[52] U.S. Cl. ........................ 365/103; 357/91; 365/118; 365/178
[58] Field of Search ............ 357/91; 340/173 CR, 340/173 SP; 313/391

[56] References Cited

U.S. PATENT DOCUMENTS

| | | | |
|---|---|---|---|
| 3,272,661 | 9/1966 | Tomono et al. | 357/91 |
| 3,599,181 | 8/1971 | Dearnaley | 340/173 CR |
| 3,653,977 | 4/1972 | Gale | 357/91 |
| 3,657,708 | 4/1972 | Kroy et al. | 340/173 CR |
| 3,701,979 | 10/1972 | Smith et al. | 340/173 CR |
| 3,761,895 | 9/1973 | Ellis et al. | 340/173 CR |
| 3,841,917 | 10/1974 | Shannon | 357/91 |
| 3,886,530 | 5/1975 | Huber et al. | 340/173 CR |

OTHER PUBLICATIONS

Bjorkquist, et al., Lattice Location of Dopant Elements Implanted into Ge, Applied Physics Letters, 12/1/68, vol. 13, No. 11, pp. 379-381.

*Primary Examiner*—Stuart N. Hecker
*Attorney, Agent, or Firm*—Geoffrey H. Krauss; Joseph T. Cohen; Jerome C. Squillaro

[57] ABSTRACT

A non-volatile archival memory storage media has a planar junction diode structure into which are written a plurality of diode bits permanently formed at or beneath the top surface thereof by selective ion implantation. Each of the plurality of ion implanted regions represents a data bit of a first binary value, with the remaining un-implanted regions of the planar diode representing data bits of the remaining binary value. The permanently stored data is read by inducing a flow of current by recombination phenomena responsive to a scanning electron beam sequentially incident on each of the possible data bit sites of an array of such sites in the planar diode. Wide bandwidth methods for writing the ion implantation sites into the planar diode media are disclosed.

21 Claims, 7 Drawing Figures

ION IMPLANTED ARCHIVAL MEMORY MEDIA AND METHODS FOR STORAGE OF DATA THEREIN

BACKGROUND OF THE INVENTION

The present invention relates to archival memory devices and more particularly to novel ion implanted memory media and methods for the storage of digital data therein.

Modern information-processing applications frequently require the ability to store large quantities of data, usually in a digital binary format. The storage media must be non-volatile, whereby data is stored without change in content over long periods of time. In many applications, such as Social Security accounting and technological information retrieval systems, the digital information is initially entered into the memory and maintained essentially in an unchanged state for the entire storage interval, once the authenticity and parity of the data written into the memory is confirmed. Consequently, such memories are usually referred to as "read-mostly" memories, i.e., data is initially written; almost never changed in content; and is relatively permanently maintained therein with long intervals between writing of additional data, with frequent read operations being enabled to repeatedly retrieve the same stored information.

These archival memories require extremely high data capacity, frequently exceeding one tera-bit ($10^{12}$ bits) per memory device. Entry of such vast amounts of data require the memory to be capable of extremely high writing (input) speeds, while useful reading (output) of the stored information mandates that wide bandwidth be provided. Additionally, the output signal should possess exemplary signal-to-noise ratios (requiring high device gain), so as to produce the required read-data reproducibility.

STATE OF THE ART

One "read-mostly" device capable of fulfilling the above-stated requirements is described in U.S. Pat. No. 3,761,895, entitled "Method and Apparatus for Storing and Reading Out Charge in an Insulating Layer", issued Sept. 25, 1973 and assigned to the assignee of the present invention. The memory media, or target, described in the aforementioned U.S. Patent requires a four layer structure: a p-type semiconductor substrate; an n-type semiconductor layer grown upon the substrate; a dielectrically insulated layer deposited upon the n-type semiconductor; and a metallized layer deposited upon the top surface of the dielectric layer. Entry of information is by use of an electron beam to write or deposit a quantity of electrical charge into the dielectric layer, when the metal layer is biased at a first potential with respect to the substrate for storage of data at selected sites therein. The memory is read by changing the bias potential to cause magnitude variations of the current flowing through the p-n junction (which junction is reverse biased) responsive to the electron beam being incident upon a charged site. The memory media is completely erased, in non-recoverable manner, by scanning the electron beam completely across the array of possible data sites with a third bias potential applied, to discharge all storage sites; this technique of erasure, while beneficial in certain applications, also presents the possibility of accidental erasure of at least a portion of the memory plane should the bias switching mechanism malfunction during electron beam scanning.

A memory target incapable of having its data patterns modified by the scanned electron beam (utilized for data reading) is desirable. The use of a memory media or target which does not require the time consuming and costly additional deposition processes for the dielectric and metallization layers is also desired. Additionally, a target media which removes the necessity for a plurality of target bias potentials (and the sources and switching required to implement the same) will not only result in greater memory reliability, but will also reduce the possibility of erroneous data readout.

BRIEF SUMMARY OF THE INVENTION

In accordance with the invention, archival memory media capable of having its information content modified responsive to an incident ion beam comprises a planar diode having a semiconductor substrate of a first polarity-type, upon the surface of which substrate a semiconductor layer of opposite polarity-type is fabricated and into which layer each of a plurality of implantation regions of semiconductor material of the first polarity-type are formed at selected ones of a plurality of implantation sites arrayed in the plane of the top surface of the layer, by the action of an incident beam of ions of the first polarity-type.

The focussed ion beam may selectively implant the small regions of first polarity-type semiconductor at or beneath the top surface of the planar diode. Each implanted region represents a stored data bit of identical binary value, e.g., one, while the absence of an implanted region at a second site represents a stored data bit having the remaining binary value, e.g., zero.

The speed at which information is written into the memory media may be adjusted by suitable choice of: the ionized element utilized; are of the collimated ion beam and its alignment to the crystallographic axes of the semiconductor layer of the second polarity-type; or by judicious selection of ancillary physical characteristics such as substrate temperature during the writing process, annealing of the substrate thereafter or other ancillary amphorism-modification techniques.

The stored information in the memory media is read by scanning the top surface of the planar target structure with a collimated electron beam, to cause production of electronhole pairs therein. The holes diffuse across a depletion region formed at the boundary between the implanted semiconductor region and the underlying and adjacent semiconductor layer to recombine with electrons. Use of a high energy ion beam forms implanted regions, in one preferred embodiment, close to the substrate whereby hole diffusion produces a flow of signal current (binary "one"), while formation, in another preferred embodiment, of the implanted region at and immediately below the top surface of the semiconductor layer causes the holes to recombine before reaching the planar diode depletion layer, whereby a flow of signal current is prevented (binary "zero").

The gradient of conductivity impurity dopants may, in a preferred embodiment, be adjusted to either further enhance local recombination of generated holes in the "zero" regions of the array or to further inhibit the recombination in the "one"regions of the array. Similarly, suitable impurities may be introduced to increase the surface recombination velocity for the minority carriers, thereby reducing the magnitude of lateral diffusion of the minority carriers into the region occupied by an adjacent data bit, to enhance the data storage site density of the memory.

Accordingly, it is one object of the present invention to provide a novel archival memory media.

It is another object of the present invention to provide a novel archival memory media target capable of having its information content modified by an incident ion beam.

It is still another object of the present invention to provide a novel archival memory media target capable of having its information content read by a beam of different characteristics from the beam utilized in writing information into the target.

It is yet another object of the present invention to provide a novel memory media target enabling minimal lateral spacing between adjacent data storage sites, to increase the data capacity thereof.

It is a further object of the present invention to provide a novel memory media target in which the effects of reading a particular data storage site rapidly disappear, to increase the rate at which adjacent data storage sites may be scanned and read.

It is a still further object of the present invention to provide novel methods for forming such novel memory media targets and for further reducing degradation effects thereon.

These and other objects of the present invention will become apparent to those skilled in the art upon a reading of the following detailed description and the drawings.

DETAILED DESCRIPTION OF THE INVENTION

Figure 1:
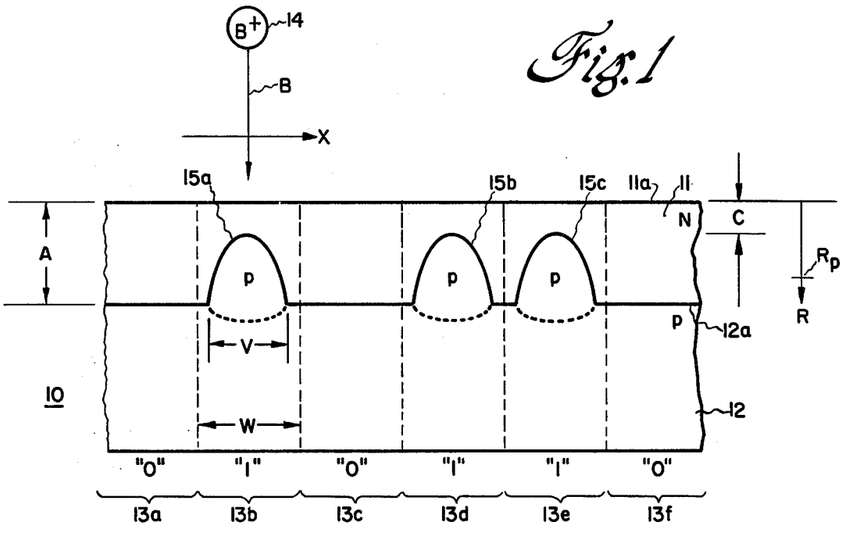
FIG. 1 is a side view of the interior of a first embodiment of a novel memory media target in accordance with the invention, and illustrating ion implantation of a data bit.

Referring initially to FIG. 1, a memory media target 10, in a first preferred embodiment, comprises a planar diode formed by a semiconductor layer 11 of n-type semiconductor material fabricated upon a substrate 12 of p-type semiconductor material. A two-dimensional array of possible data sites 13a, . . . , 13z, is assigned to the planar diode. For purposes of simplicity, a portion of only one row (or column) of the storage site array is illustrated in FIG. 1, with sequential data storage sites 13a-13f being shown. It should be understood that the planar array may extend both leftwardly and rightwardly with respect to the portion shown in FIG. 1 and into and out of the plane of the drawing, to a degree as required for storage of the desired number of data bits, with the array having the bit spacing limitations as described hereinbelow.

The n-type semiconductor layer 11 may be suitably doped silicon grown by a gas diffusion process to a height A, typically of the order of 0.3 microns, above the top surface 12a of the p-type silicon substrate 12. It should be understood that other methods, such as epitaxial growth, ion implantation and the like, may be utilized to fabricate layer 11 upon substrate 12.

Figure 4:
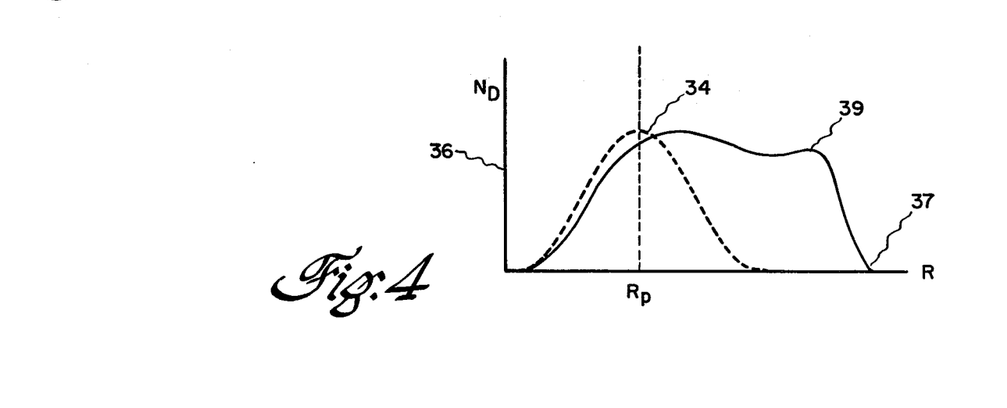
FIG. 4 is a graph of impurity dopant concentration versus implantation depth into the grown layer of the planar diode for equal energy ion beams and with 0° and 10° c incident angles with respect to the crystallographic axis.

A collimated beam B of ions 14 of a suitable element, such as the positively charged ions of boron for use with a layer 11 of n-type semiconductor material, is selectively directed substantially normal to the top surface 11a of layer 11 at essentially the center of each data storage region 13 in which a single bit of information having a first binary value, herein chosen to be a binary one, is to be implanted. A suitably high magnitude of energy is imparted to ions 14 by known means, to cause the ions to be implanted at some distance R below top surface 11a to form each of small regions 15 of p-type semiconductor material below top surface 11a of layer 11. The final energy imparted to each of ions 14 varies in probabilistic manner, as does the number of collisions with the atoms of layer 11 during implantation. Ions 14 halt at varying depths R below top surface 11a, with the final distribution (FIG. 4, curve 34) probabilistically assuming a Gaussian distribution about a design implantation depth $R_p$.

Each p-type semiconductor regions 15 is preferably implanted in n-type layer 11 by utilization boron ions, as a relatively large fraction of the boron atoms will be substitutionally implanted in the silicon lattice, especially when the implantation process is carried out at room temperature. A large fractional value of lattice substitution is desirable, as the substitutional atoms contribute to the level of dopant in the fabricated layer.

The high concentration of positively charged acceptor ions (such as boron) implanted in region 15 changes the dopant polarity from the normal negative polarity of the n-type material to that of a positive p-type material. It should be understood that the semiconductor material (herein described as silicon) may be varied and that the impuvity dopants of layer 11 and substrate 12 may be interchanged, with a corresponding change of the element utilized for ions 14 (a beam B of ions generally of a column V element, such as phosphorous or the like, being utilized for implantation of n-type regions 15 in p-type layer 11).

As illustrated, beam B of positively charged ions 14 is scanned in direction X and is selectively energized or modulated to implant each of p-type regions 15 in an associated region of the planar array having data of binary one value. Thus, for illustrated data storage sites 13a-13f having a binary data pattern 010110, beam B is initially modulated to the "off" condition, wherein ions 14 do not impinge upon surface 11a, as the beam is swept in the X direction to be initially positioned above first storage site 13a; the absence of positively charged ions 14 incident on site 13a effects no change in the doping level of layer 11 thereat.

Beam B is scanned (rightwardly, as viewed in FIG. 1) to impinge essentially at the center of second data storage site 13b, which site is to be implanted as a binary one bit of information. The beam is modulated to the "on" condition, whereby a finely focussed stream of ions 14 impinge upon top surface 11a of the planar diode and implant p-type dopants in region 15a in layer 11. By suitable choice of (1) the thickness A of layer 11; (2) the type of ions 14; and (3) the average energy imparted to the ions in beam B, the implanted region will extend from at least the upper surface 12a of substrate 12 to a depth C below layer top surface 11a, and the implanted region will be centered about optimal implantation depth $R_p$. We have found that a suitable layer thickness A is of the order of 0.3 microns, with ion implantation narrowing the minimal n-type layer thickness C, between top surface 11a and the nearest point of implanted p-type region 15, to the order of 0.1 microns. The resulting width W, assigned to each data storage site in the planar array, is of the order of 0.3 microns.

Beam B is further sequentially scanned rightwardly in the X direction and is modulated between the "off" and "on" conditions to implant each of the remaining plurality of p-type regions 15b, 15c, . . . in the array. Thus, beam B is modulated "off" as it is scanned to the center of site 13c, to "implant" a binary zero bit; is modulated to the "on" condition for ion implantation of p-type regions 15b and 15c, respectively, at each of storage sites 13d and 13e, respectively, to store binary one values thereat; and is modulated to the "off" condition when scanned to storage site 13f to store a binary zero value thereat.

Implanted regions 15 (or the lack thereof, such as at sites 13a, 13c and 13f) permanently store the assigned data value beneath the surface of the planar diode, whereby the data can not be destroyed as long as the media remains intact. It should be understood that, while a storage site previously having a binary zero value (and, therefore, being devoid of an implanted region 15) may subsequently be modified to have a binary one value by ion implantation of such region 15, the data sites previously implanted with ions 14 cannot subsequently be "erased" by modification to an unimplanted (binary zero value) site. Thus, while additional data may be written into previously unused portions of the memory array plane, and previously written data may be modified by the addition of binary one values at sites previously recorded as a binary zero bit, the write process occurs in a single direction. The memory media target of the present invention will normally have a major portion of the data site array written in a single scanning process and will contain large quantities of permanent data, which can be repeatedly accessed and read from target 10 (as described hereinbelow), that is, will be a "read-mostly" memory, with other memory devices providing for temporary storage of variable data trains.

Figure 2:
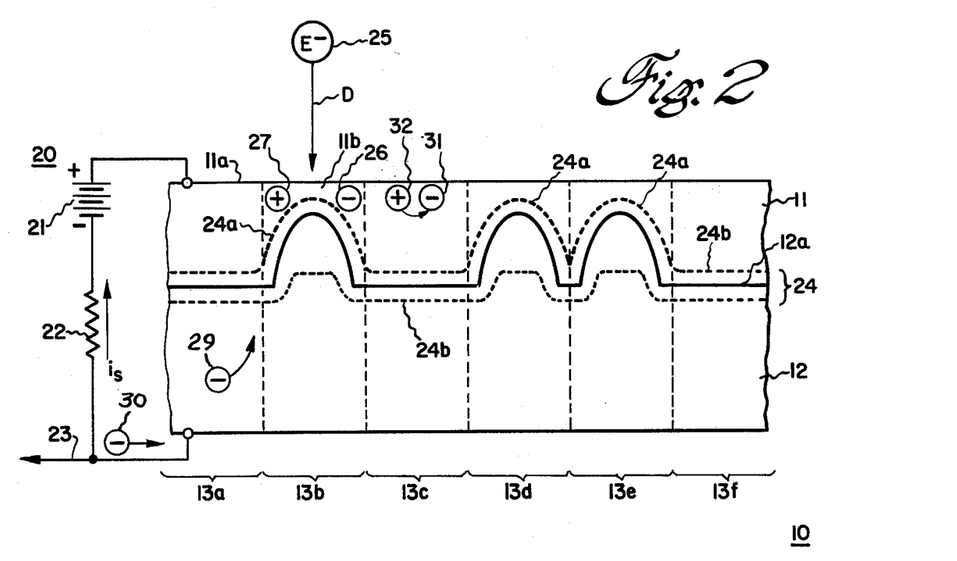
FIG. 2 is a side view of the interior of the memory media target of FIG. 1 illustrating minority carrier production during a position of the read-cycle scan and useful in understanding the principles of the present invention.

Referring now to FIG. 2, wherein like reference designations refer to like elements, an external read-bias circuit 20, comprising a source 21 of electrical potential in electrical series connection with a load 22, is coupled between layer top surface 11a and substrate 12. A memory media output connection 23 is coupled to the junction between load 22 and substrate 12. The polarity of potential source 21 is arranged to reverse bias the planar diode junction region whereby a depletion region 24 is created in a known manner thereabout, with portions 24a of the depletion region associated with implanted regions 15 following the doping contours therein and, therefore, being closer to epitaxial top surface 11a than the portions 24b of the depletion region in the unimplanted data sites.

In operation, data stored in memory media target 10 is read by scanning a finely focussed beam D of electrons 25 across the surface of the target site array. Beam D is collimated and scanned by suitable electrostatic or electromagnetic means, such as the deflection arrangement described in aforementioned U.S. Pat. No. 3,761,895, although other electron beam scanning and collimation means may be equally well adapted for use with the present invention, and do not form a part thereof. Electrons 25 are accelerated with a potential, on the order of 10 kilovolts, to impart sufficient energy to the electrons to cause entry of the electrons into layer 11 above depletion region 24a and to generate a local excess of electron-hole pairs therein.

Scanning of beam D to a data storage site, illustratively array site 13b, having an implanted p-type region 15a, causes generation of pairs of electrons 26 and holes 27 in the thin region C between top surface 11a and the underlying adjacent main diode depletion region 24a. A large fraction of holes 27 diffuse to depletion region 24a causing a reduction in the charge in the depletion region capacitance. The holes recombine with electrons 29 (excess free carriers) in p-type substrate 12. Electron-hole recombination causes a replenishment flow of electrons 30 from the negative terminal of potential source 21 into substrate 12, to produce a signal current $i_s$ through load 22. A flow of signal current $i_s$ causes a voltage to form across load 22, which signal voltage appears at memory output 23, for subsequent data processing external to target 10. As each electron-hole pair only requires about 3.5 e.V. of energy for its creation, a scanning beam accelerated to about 10 k.e.V. will produce at least 1000 holes actually recombining in the vicinity of depletion region 24a, whereby a current amplification factor of greater than 1000 is achieved.

When electron beam D is scanned to a data site devoid of an implanted region 15, such as data site 13c, the local excess of electron-hole pairs generated by the beam is created at a relatively large distance from the underlying depletion region 24b, and the recombination of electrons 31 and holes 32 will occur locally. The predominant local recombination occurs in n-type semiconductor layer 11, whereby a minimal quantity of holes 22 diffuse to depletion region 24. Thus, there is no substantial recombination of holes 32 with any electrons from substrate 12, a minimal magnitude of signal current $i_s$ flows through load 22, and a substantially zero magnitude voltage is present at signal output 23 for subsequent processing as a binary zero (positive logic) signal.

Resolution between adjacent sites 13 (and hence, data density) is dependent upon the width W (FIG. 1) assignable to each data site 13a–13f of the array. Width W must be large enough to assure minimal diffusion of excess minority carriers (holes 32) laterally into the layer 11 of a written site (such as site 13b) from an adjacent unwritten site (such as sites 13a and 13c), as lateral diffusion in the thin n-type layer 11b will produce a discernable level of signal current $i_s$ when one of unwritten sites 13a or 13b is scanned by electron beam D. Lateral diffusion is minimized if the surface recombination velocity of surface 11a is large whereby the excess minority carriers (holes) recombine before they diffuse to the adjacent data sites. By reducing the thickness of n-type layer 11 (with the inherent advantage that most minority carriers generated in an implanted region 15 actually reach depletion region 24a and cause signal current flow when the written region is addressed) and exercising suitable control of the surface recombination velocity at or adjacent to top surface 11a of the unwritten regions, lateral diffusion is minimized and improved resolution and data site density is facilitated.

Maximization of surface recombination velocity is accomplished by selection of the doping gradient, i.e. the quantity of impurity atoms substitutionally activated in the semiconductor lattice, at or adjacent to top surface 11a, with reduced n-type doping at the surface increasing the top surface recombination velocity. Introduction of atoms of an additional impurity type, such as gold and the like, will also increase surface recombination velocity. The addition of gold atom impurities to n-type layer 11 has the additional advantage of reducing the bulk minority carrier lifetime in the n-type semiconductor layer to the order of $10^{-10}$ seconds, whereby the diffusion length before recombination is reduced to the order of 0.3 microns, a distance commensurate with data site center-to-center spacings of the order of 1-2 microns.

Improved resolution is also obtainable by reducing the lateral width V of each implanted p-type region 15, to further lengthen the diffusion distance encountered by one of holes 32 laterally diffusing from an unwritten site, such as 13c, into depletion region 24a.

Figure 3A:
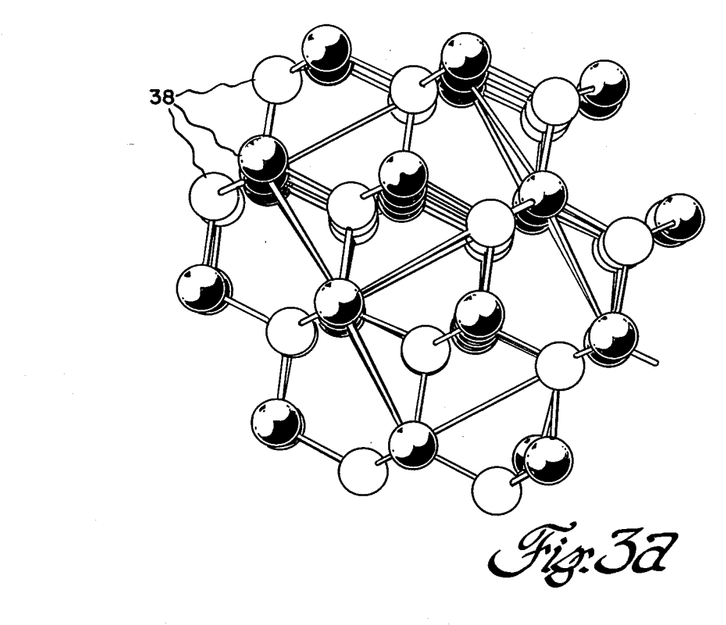
FIGS. 3a and 3b are representations of the crystal lattice of a semiconductor viewed with respective angles of zero degrees and 10° relative to the crystallographic axes thereof and useful in understanding the principles of the present invention.
Figure 3B:
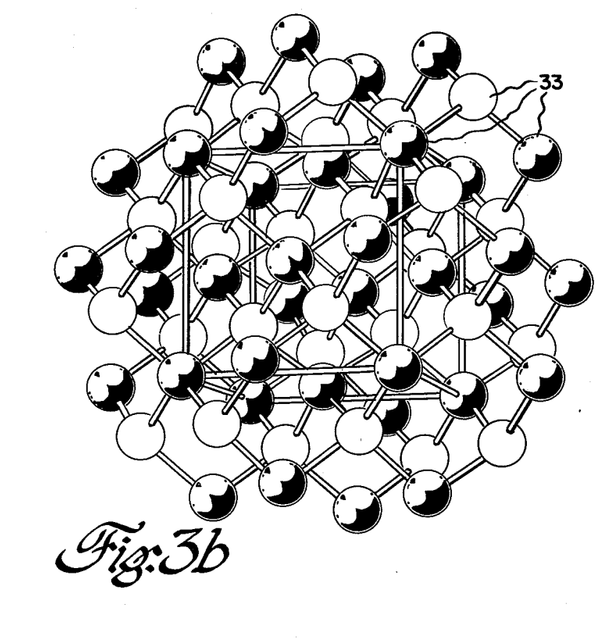

Referring now to FIGS. 3a and 3b, we have found that a particularly desirable technique to achieve a relatively narrow implant width V utilizes ion channeling through the semiconductor lattice. Known semiconductor production techniques cut silicon crystals at an angle $\theta$, where $\theta$ is greater than 2°, with respect to the crystallographic axis. As seen in FIG. 3b, wherein $\theta = 10°$ relative to the <110> axis, the lattice presents a maximal scattering cross-section in that the lattice sites of a particular area are arranged to cause the atoms 33 thereat to have maximum disalignment; the semiconductor lattice may be considered as being amorphous. Impinging ions will enter the lattice to a distance R (FIG. 1) having a Gaussian distribution (as shown in curve 34 of FIG. 4, wherein ordinate 36 indicates increasing values of implanted dopant atoms $N_D$ and abscissa 37 indicates increasing implantation depths R) about the predicted penetration distance $R_P$, due to the high probability of atomic blocking of ion travel.

A crystal cut precisely on its crystallographic axis, and hence having an angle $\theta = 0°$, as shown in FIG. 3a, relative to the <110> crystallographic axis, has its lattice sites aligned in relatively linear stack fashion, whereby the lattice site atoms 38 block a relatively small percentage of the available volume. A beam of ions (or electrons) will penetrate to a relatively greater average depth, as indicated by curve 39 of FIG. 4, before encountering a lattice atom and being halted or scattered. Equally as important is the fact that, because the ions encounter less "resistance", the energy imparted to the ion beam may be reduced to obtain the same predicted penetration distance $R_P$. Because the 0° crystallographic orientation and the lower energy ion beam will produce less scattering, the p-type implanted region 15 will tend to be narrower and penetrate through most of the n-type epitaxial layer 11 to terminate just below top surface 11a, yielding a minimal thickness layer 11b.

The desired zero degree (with respect to the crystallographiaxis) orientation may be enabled by mechanically orienting target wafer 10 or by electronically tilting the angle $\phi$ at which the ion beam B (FIG. 1) impinges upon top surface 11a of the memory media. The magnitude of signal current $i_s$, caused to flow through depletion region 24 (FIG. 2) responsive to implantation of ions 14, is monitored and the orientation of incident ion beam B is varied with respect to top surface 11a to maximize the signal current, which current maximum indicates exact beam alignment with the crystallographic axis.

A greater fluence of ions 14 may be directed against the area in which implanted region 15 is being formed, to cause the surrounding portion of region 11 to become amorphous; the damaged region is subsequently annealed and epitaxially regrown. This epitaxial regrowth wil have a larger fraction of the implanted ions in an electrically active condition, i.e. substitutionally engaged at lattice sites, but tends to widen the width W assignable to each data storage site 13a-13f, as well as increasing the ion beam dwell time at each site and consequently reducing the writing bandwidth. An alternative method is to pre-damage the entire layer 11 by pre-implantation with silicon or an inert gas, such as neon, argon and the like, at a relatively low temperature, prior to writing the implanted regions 15 with a beam of reduced fluence and following the reduced fluence ion beam writing step with a mild annealing process at relatively low annealing temperatures to produce high electrical activity in a relatively thin implanted region.

A relatively high number of electrically active centers can be provided by a suitable choice of the ions implanted. Several examples of suitable ion choice are thallium ions for implantation at room temperature and antimony ions for implantation at a temperature in the region of 350°.

Thus, by suitable choice of ion species, pre-implantation of the planar diode to a desired degree of amorphism, post-annealing, crystallographic orientation and selection of ion acceleration voltage, the desired high electrical activity of the substitutional atoms is facilitated while implanting a region 15 having minimal width V and maximal protection from erroneous signal generation due to lateral diffusion of excess minority carriers produced by the scanning electron beam impinging upon an adjacent data site.

Figure 5:
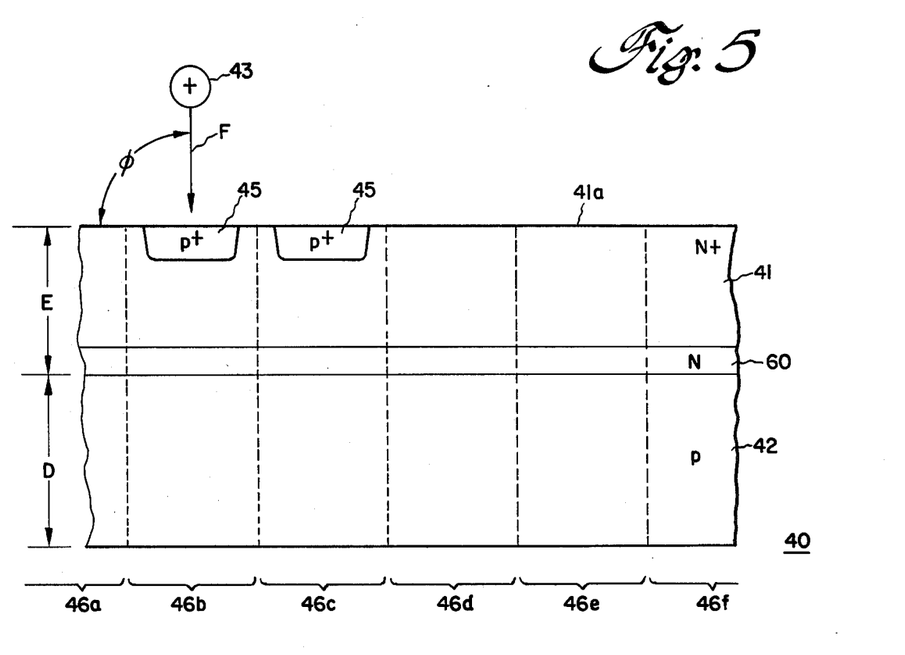
FIGS. 5 and 5a are side views of the interior of another embodiment of a novel memory media target respectively during ion implantation of a data bit and during a portion of the read-cycle scan.

Referring to FIG. 5, another preferred embodiment of our novel memory media utilizes a target 40 formed of a planar diode having a layer 41, herein illustrated as being of heavily doped n+-type silicon, fabricated upon a substrate 42, herein illustrated as being a relatively lightly doped p-type silicon semiconductor. Advantageously, the thickness D of substrate 42 is relatively much greater compared to the thickness E of layer 41, which advantageously will be in the range of approximately 0.1-1.0 microns. Ions 43, herein illustrated as having a positive charge, in ion beam F are directed against the surface 41a of layer 41 with relatively low energy, whereby regions 45 are implanted at and adjacent to surface 41a. Fluence of beam F is relatively heavy whereby regions 45 receive a relatively large quantity of donor ions and hence are formed as heavily doped p+ areas, each acting as an unbiased diode in conjunction with the n+ layer 41. It should be noted that, in this embodiment, implanted regions 45 are written at each of data storage sites 46a-46f at which a binary zero value is to be recorded, with unwritten sites representing a binary one value, in contradistinction to the preferred embodiment described for FIGS. 1 and 2.

Figure 5A:
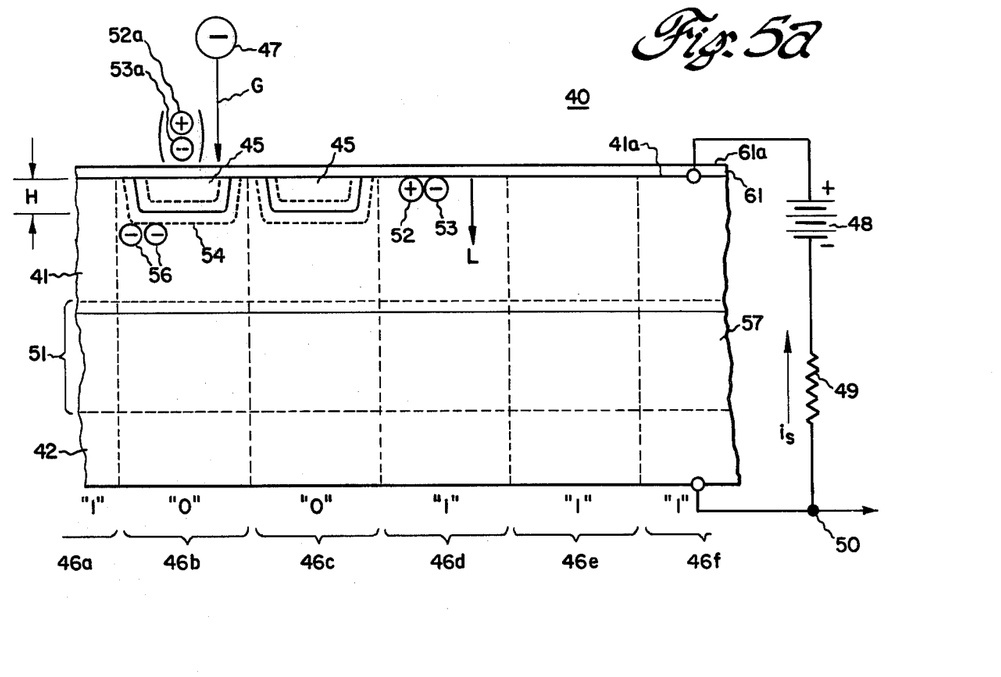

Referring now to FIG. 5a, in practice memory media target 40 is read by sequentially scanning a finely focussed beam G of electrons 47 to impinge upon top surface 41a of the planar diode structure. Target diode 40 has previously been relatively strongly back biased by potential source 48 applying a relatively large negative potential to substrate 42 with respect to layer surface 41a. The potential of source 46 is applied through signal load 49, with the memory plane output 50 being taken from the junction between substrate 42 and load 49. The relatively large reverse-bias potential of source 46 causes a depletion region 51 to form between, and extending into, layer 41 and substrate 42. As layer 41 is relatively heavily doped and substrate 42 is relatively lightly doped, depletion region 51 extends only a short distance into layer 41 but a relatively large distance into substrate 42 to provide a minimal electrical capacitance for the depletion region, thereby improving the signal-to-noise ratio of readout signal $i_s$.

Beam G is accelerated to an energy chosen to produce a large number of electron-hole pairs at a depth into substrate 41, relative to top surface 41a, less than the depth H of the implanted p+ regions 45. For regions 45 having an implanted depth of approximately 0.1 microns, the beam energy is of the order of 2.5keV. Electron beam G causes a plurality of pairs of holes 52 and electrons 53 to be formed slightly below top surface 41a. When the beam impinges upon an unwritten data site, such as data site 46d, the minority carriers (holes) diffuse toward the n+p diode depletion region 51. The diffused minority carriers recombine to generate a signal current $i_s$ in external load 49, and hence provide a relatively high signal level at output 50, to output a binary one data bit from the memory media. As each electron-hole pair requires 3.5 e.V. for its production, a scan electron beam of 2.5 k.e.V. energy will produce approximately 780 excess minority carriers, of which approximately 500 may be expected to diffuse to depletion region 51 to cause signal current flow. Thus, signal current will be approximately 500 times the current of beam G, for a current gain on the order of 500 times.

When electron beam G impinges upon a recorded area, such as data site 46b, the excess minority carriers, being electrons 53a in a p+-type semiconductor, diffuse through implanted bit depletion region 54 to "line" the depletion region-layer boundary, as at 56. As there is no diffusion of holes 52a through layer 41 to main depletion region 51 and as electrons 53a recombine locally, a minimal flow of signal current $i_s$ is induced to flow through load 49, with a relatively low output at media target output 50, indicative of a binary zero data value.

The signal-to-noise ratio for memory media target 40 may be defined as the ratio of signal current $i_s$ flowing when electron beam G impinges upon a binary one (unwritten) data site (e.g., 46d) to the signal current $i_s$ flowing when beam G is incident on a written binary zero data site (e.g., 46b). This ratio is increased by forming the doping gradient of the n+ layer 41 to have its greatest dopant concentration at or adjacent to top surface 41a and, therefore, with the doping concentration being reduced towards the n+ junction 57. The desired dopant gradient may be achieved by process control methods, such as multi-voltage ion implantation techniques and the like. The tapering doping gradient produces an internal field in n+ layer 41 which tends to drive the minority carriers (holes) away from top surface 41a, a phenomena which is desirable in this embodiment as the top surface is likely to have a high surface recombination velocity tending to reduce the read current gain for a binary one (unwritten site).

Dopant concentrations of the order of approximately $10^{18}$ active dopant atoms per cubic centimeter have been found appropriate for a memory media plane 40 having a center-to-center data bit spacing of 0.1 microns. However, this relatively small data site spacing is of the same order as the thickness of implanted diodes 45 and tends to allow minority carriers (holes) to be collected by adjacent p+ diode regions during operation, which collection results in degraded gain for a binary one site. The tapering doping gradient, hereinabove described, tends to circumvent this problem by inducing a doping gradient field L of magnitude:

$$L = (kT/q_e)dln(N(x))/dx$$

where $N(x)$ is the net doping concentration. Thus, for doping gradients of the order $10^{19}$ atoms per cubic centimeters per micron, internal field L will have a magnitude of the order of 5 kilovolts per centimeter, which magnitude is sufficient to overcome the lateral diffusion of holes into written sites and to assure that a high percentage of holes 51 diffuse to depletion region 51 for recombination thereat.

Again referring to FIG. 5, an additional layer 60 of relatively lightly doped n-type material may be interposed between n+ layer 41 and p layer 42 to prevent the depletion field 54 (of the p+n+ diodes, formed by implanted region 45 with the underlying layer 41), from penetrating through to the main depletion region 51 and causing a relatively large flow of signal current $i_s$ for a binary zero value. The thickness of lightly doped n-type regions 60 is not critical, although a certain minimum thickness is advisable to prevent diode punch-through phenomena from occurring.

In order to assure a wide read bandwidth, top surface 41a should present a low resistance contact across the entire planar array. The resistance of top surface 41a presents a time response limitation proportional to the product of the capacitance per unit area of the main depletion region 51, and the resistance per square of the top surface 41a of heavily doped n+ semiconductor layer 41. We have found that deposition of a thin, highly conductive film 61 (FIG. 5a), of aluminum, chromium or the like, will appreciably reduce the value of top surface resistance. However, the imposition of a conductive layer between the incident electron beam G and the underlying layer 41 and its selectively implanted diode regions 45 will reduce the quantity of electrons 47 incident upon top surface 41a, with consequent reduction in the ratio of signal current from the binary one data sites. Thus, the acceleration voltage for electron beam G must be chosen so that electron-hole pair production still occurs in implanted regions 45 and in unwritten regions 41 of binary one data sites.

An additional advantage to the use of conductive layer 61 is that the implanted diode tends to be shorted out by conductive path formation across its depletion region 55. This shorting path improves the memory media performance as it assures rapid relaxation of charge separation across the p+n+ diode regions during a read scan, whereby electrons 56 are shunted from the n+ layer into p+ regions 45 for rapid recombination with excess holes 52a. With suitable choice of the resistivity of the material deposited to form film 61, this relaxation phenomena will occur on a time scale slightly shorter than the time during which the reading electron beam G lingers at any one of data sites 46a-46f, whereby the implanted diode will be only partially discharged before the scanning beam has moved to the next adjacent site, to prevent the diffusion of some of holes 52a to the main planar diode depletion region 51 with associated flow of signal current $i_s$ for a binary zero data bit.

Layer 61 of suitable material may be deposited before the writing of implantation region 45 by ion beam F. Subsequent focus of the ion beam upon the surface of an implantation site will cause the energetic incoming ions 43 to come to rest closer to surface 41a, to provide the desired doping profile to cause each region 45 to have the required heavy p-type doping. This approach is preferable from an ion-optics viewpoint, as it is desirable to utilize higher ion beam energies, in the order of 100 k.e.V., for formation of a suitably collimated ion beam F.

The present invention has been described with respect to several preferred embodiments; many variations and modifications will now occur to those skilled in the art. In particular, the substitution of other semiconductors for silicon as described in the present description. For example, germanium is an attractive semiconductor due to its process requirements and properties being almost as well known as silicon, and, in addition, its higher mass density will improve the resolution of the reading process due both to reduced electron penetration and scattering and to a higher electron-hole pair production rate, because of germanium's smaller energy bandgap relative to silicon, producing an increase in diode signal. Similarly, the choice of dopant atoms may be varied, with dopants from columns V and VI of the periodic table, such as phosphorus, bismuth, selenium, or the like, typically being used to implant n+ regions. As previously mentioned, the designation of p-type and n-type regions in the novel device of the present disclosure may be interchanged. Thus, we do not intend to be limited by the present disclosure but only by the appending claims.

What we claim as new and desire to secure by Letters Patent of the United States is:

1. An archival memory target comprising:
semiconductor means for forming a planar diode structure having an array of a first plurality of data sites defined thereon; and
semiconductor means for forming an auxiliary diode structure in a semiconductor layer of said planar diode means at each of a selected second plurality of said data sites for permanently storing thereat a data bit having a first binary value, said second plurality being less than said first plurality of data sites;
the remaining ones of said first plurality of data sites being devoid of said auxiliary diode means to store a data bit thereat having a remaining binary value.

2. A memory media target as set forth in claim 1, wherein said planar diode means comprises a substrate formed of a semiconductor material of a first polarity-type; and said semiconductor layer is a layer of said semiconductor material having an opposite polarity-type and is fabricated upon a first surface of said substrate.

3. A memory media target as set forth in claim 2, wherein each said auxiliary diode means comprises an implanted region of said semiconductor material of said first polarity-type selectively formed in said layer responsive to bombardment of said layer by a collimated beam of ions.

4. A memory media target as set forth in claim 3, wherein said ion beam possesses energy sufficient to form each said implanted region entirely below a top surface of said layer and in continuity with said substrate.

5. A memory media target as set forth in claim 4, wherein the distance between said top surface of said layer and a closest point thereto of each said implanted region is of the order of about 0.1 to about 1.0 microns.

6. A memory media target as set forth in claim 3, wherein each said implanted region extends a first selected depth into said grown layer from a top surface thereof, a portion of said layer intervening between each said implanted region and said substrate.

7. A memory media target as set forth in claim 6, wherein said first selected depth is of the order of about 0.1 to about 1.0 microns.

8. A memory media target as set forth in claim 6, wherein said implanted region has a concentration of dopants relatively greater than the dopant concentration in said substrate.

9. A memory media target as set forth in claim 8, further comprising another layer interposed between said layer and said substrate, said another layer having a dopant concentration relatively less than the dopant concentration of said layer and is of said opposite polarity-type.

10. A memory media target as set forth in claim 6, further comprising conductive means positioned upon said top surface of said layer for forming a conductive path between each said implanted region and a laterally adjacent portion of said layer, to facilitate excess minority carriers induced in said implanted region to flow through said conductive means to said layer for rapid recombination.

11. A memory media target as set forth in claim 3, wherein said layer has a crystallographic axis oriented with an angle of essentially zero degrees relative to the axis of said beam of ions to facilitate channeling of said ions into said layer.

12. A memory media target as set forth in claim 2, wherein said layer includes means for urging excess minority carriers toward a depletion region formed at the junction between said substrate and said layer when said planar diode means is reverse biased.

13. A memory media target as set forth in claim 12, wherein said carrier urging means comprises a doping profile, for the dopant atoms positioned in the semiconductor lattice, having a greatest concentration below and adjacent to said top surface of said layer and lessening toward said junction.

14. A memory media target as set forth in claim 2, wherein said layer further comprises means for increasing the surface recombination velocity for excess minority carriers to substantially prevent lateral diffusion thereof.

15. A memory media target as set forth in claim 14, wherein said surface recombination velocity increasing means comprises an additional dopant material introduced into said layer.

16. In combination, the memory media target of claim 1 and:
output circuit means coupled to said planar diode means for reverse biasing the junction thereof; and
means for scanning an electron beam across the array of data storage sites in said planar diode means to induce production of pairs of electrons and holes therein;

said holes causing a signal of a first value in said output circuit responsive to said electron beam being focussed upon one of said data sites having said auxiliary diode means;

said output circuit having a signal of a second magnitude different from said first magnitude formed therein when said electron beam impinges upon a data site devoid of one of said auxiliary diode means.

17. A combination as set forth in claim 16, wherein said output circuit means further comprises load means in electrical series connection between said biasing means and said planar diode means for producing said output signal responsive to a flow of current between said biasing and planar diode means.

18. A method for storing bits of data in a memory medium, said method comprising the steps of
providing a planar semiconductor diode structure having a first surface on which is defined an array of possible data storage sites;
implanting a region of semiconductor material into one layer of said planar diode structure to form an auxiliary diode therein only at each selected one of a plurality of said data storage sites to permanently store a first data value thereat; and
preventing implantation of a semiconductor auxiliary diode region at each of the remaining ones of said plurality of data storage sites to store a remaining data value thereat.

19. A method as set forth in claim 18, wherein said implanting step further comprises the steps of: focussing an ion beam upon the first surface of said planar diode structure; scanning said ion beam to each of said plurality of data storage sites at which a bit of said first data value is to be stored; and modulating said ion beam to a first condition to implant a quantity of ions to form one of said plurality of auxiliary diode regions at each of said selected sites to which said ion beam is scanned.

20. A method as set forth in claim 19, wherein said implanting step further comprises the step of: modulating the ion beam to a second condition to prevent implantation of one of said plurality of auxiliary diode regions at each site of said array at which data of a value differing from said first data value is to be stored.

21. A method as set forth in claim 18, further comprising the steps of: providing circuit means to reverse bias said planar diode structure only during the reading of data therefrom; scanning an electron beam to impinge on each of said plurality of data sites; and monitoring the flow of current in said circuit means to recover the value of the data bit stored at the data site upon which said electron beam impinges.

* * * * *